(12) United States Patent
Eisele et al.

(10) Patent No.: US 7,101,812 B2
(45) Date of Patent: Sep. 5, 2006

(54) METHOD OF FORMING AND/OR MODIFYING A DIELECTRIC FILM ON A SEMICONDUCTOR SURFACE

(75) Inventors: Ignaz Eisele, Icking (DE); Alexandra Ludsteck, München (DE); Jörg Schulze, Erding (DE); Zsolt Nenyei, Blaustein (DE); Waltraud Dietl, Illulirchberg (DE); Georg Roters, Duelmen (DE)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 10/386,163

(22) Filed: Mar. 10, 2003

(65) Prior Publication Data

US 2004/0058557 A1   Mar. 25, 2004

Related U.S. Application Data

(60) Provisional application No. 60/412,602, filed on Sep. 20, 2002.

(51) Int. Cl.
*H01L 21/44* (2006.01)

(52) U.S. Cl. ............... 438/769; 438/770; 257/E21.141

(58) Field of Classification Search ........ 438/758–769, 438/770, 773, 778, 786, 787, 775
See application file for complete search history.

(56) References Cited

U.S. PATENT DOCUMENTS

| 3,647,535 | A | 3/1972 | Naber |
|---|---|---|---|
| 4,214,919 | A | 7/1980 | Young |
| 5,726,087 | A | 3/1998 | Tseng et al. |
| 5,820,942 | A | 10/1998 | Singh et al. |
| 5,874,711 | A | 2/1999 | Champetier et al. |
| 5,904,523 | A | 5/1999 | Feldman et al. |
| 5,930,456 | A | 7/1999 | Vosen |
| 5,959,329 | A * | 9/1999 | Tomita et al. ............... 257/321 |
| 5,960,158 | A | 9/1999 | Gat et al. |
| 5,970,214 | A | 10/1999 | Gat |
| 5,970,382 | A | 10/1999 | Shah |
| 5,980,637 | A | 11/1999 | Singh et al. |
| 5,997,175 | A | 12/1999 | Champetier et al. |
| 6,027,244 | A | 2/2000 | Champetier et al. |

(Continued)

FOREIGN PATENT DOCUMENTS

EP   0984486 A2   3/2000

(Continued)

OTHER PUBLICATIONS

Article—*Growth Modes And Characterization Of Thin RTP Silicon Oxides*, I. Eisele, A. Ludsteck, and J. Schulze, 10th IEEE International Conference on Advanced Thermal Processing of Semiconductors—RTP 2002, Sep. 25, 2002, pp. 11-14.

(Continued)

*Primary Examiner*—Brook Kebede
(74) *Attorney, Agent, or Firm*—Dority & Manning, P.A.

(57) ABSTRACT

A process for forming and/or modifying dielectric films on semiconductor substrates is disclosed. According to the present invention, a semiconductor wafer is exposed to a process gas containing a reactive component. The temperature to which the semiconductor wafer is heated and the partial pressure of the reactive component are selected so that, sometime during the process, diffusion of the reactive components occurs through the dielectric film to the film/semiconductor substrate interface. Further, diffusion also occurs of semiconductor atoms through the dielectric film to an exterior surface of the film. The process of the present invention has been found well suited to forming and/or modifying very thin dielectric films, such as films having a thickness of less than 8 nm.

33 Claims, 2 Drawing Sheets

Model with two different mechanisms A and B to explain the growth of thin RTP oxides.

U.S. PATENT DOCUMENTS

| | | | |
|---|---|---|---|
| 6,034,357 A | 3/2000 | Guardado | |
| 6,056,434 A | 5/2000 | Champetier | |
| 6,075,922 A | 6/2000 | Tay et al. | |
| 6,100,149 A * | 8/2000 | Nenyei et al. | 438/308 |
| 6,114,258 A * | 9/2000 | Miner et al. | 438/787 |
| 6,160,242 A | 12/2000 | Guardado | |
| 6,174,651 B1 | 1/2001 | Thakur | |
| 6,191,052 B1 | 2/2001 | Wang | |
| 6,200,023 B1 | 3/2001 | Tay et al. | |
| 6,204,484 B1 | 3/2001 | Tay et al. | |
| 6,218,720 B1 | 4/2001 | Gardner et al. | |
| 6,222,990 B1 | 4/2001 | Guardado et al. | |
| 6,281,141 B1 | 8/2001 | Das et al. | |
| 6,310,328 B1 | 10/2001 | Gat | |
| 6,323,143 B1 | 11/2001 | Yu | |
| 6,359,263 B1 | 3/2002 | Tay et al. | |
| 6,403,923 B1 | 6/2002 | Tay et al. | |
| 6,436,846 B1 | 8/2002 | Tews et al. | |
| 6,514,876 B1 | 2/2003 | Thakur et al. | |
| 6,559,424 B1 | 5/2003 | O'Carroll et al. | |
| 6,610,967 B1 | 8/2003 | Gat | |
| 6,638,876 B1 | 10/2003 | Levy et al. | |
| 6,727,474 B1 | 4/2004 | Gat | |
| 2002/0017618 A1 | 2/2002 | Gat et al. | |
| 2002/0104619 A1 | 8/2002 | Koren et al. | |
| 2002/0137311 A1 | 9/2002 | Timans | |
| 2003/0031793 A1 | 2/2003 | Chang et al. | |
| 2003/0124820 A1 | 7/2003 | Johnsgard et al. | |
| 2003/0209326 A1 | 11/2003 | Lee et al. | |
| 2003/0235983 A1 | 12/2003 | Li et al. | |
| 2003/0236642 A1 | 12/2003 | Timans | |
| 2004/0018008 A1 | 1/2004 | Koren et al. | |
| 2004/0025787 A1 | 2/2004 | Selbrede et al. | |
| 2004/0035847 A1 | 2/2004 | Gat | |
| 2004/0084437 A1 | 5/2004 | Timans | |

FOREIGN PATENT DOCUMENTS

| | | |
|---|---|---|
| EP | 0984486 A3 | 3/2000 |
| WO | WO 0145501 A2 | 6/2001 |
| WO | WO 0145501 A3 | 6/2001 |

OTHER PUBLICATIONS

Partial International Search Report for PCT/US03/27682, Aug. 10, 2004.

Article—B. E. Deal and A. S. Grove, J. Appl. Phys. 36 (1965) 3770.

* cited by examiner

Fig.1: Model with two different mechanisms A and B to explain the growth of thin RTP oxides.

Fig. 2: 2.3nm RTP oxides. Constant growth velocites (upper curve: $v = (0.08 \pm 0.01)\ nm \cdot s^{-1}$, lower curve: $v = (0.02 \pm 0.01)\ nm \cdot s^{-1}$) as a function of oxygen partial pressure $P_0$ and temperature $T$. Two different activation energies belonging to two different growth modes.

METHOD OF FORMING AND/OR MODIFYING A DIELECTRIC FILM ON A SEMICONDUCTOR SURFACE

RELATED APPLICATIONS

The present application is based on and claims priority to a provisional application filed on Sep. 20, 2002 and having U.S. application Ser. No. 60/412,602.

BACKGROUND OF THE INVENTION

In general, an integrated circuit refers to an electrical circuit contained on a single monolithic chip containing active and passive circuit elements. Integrated circuits are fabricated by diffusing and growing or depositing successive layers of various materials in a preselected pattern on a substrate. The materials can include semiconductive materials such as silicon, conductive materials such as metals, and dielectric materials such as silicon dioxide, silicon oxynitride, silicon carbide, silicon nitride and the like. Of particular significance, the various materials contained in integrated circuit chips are used to form almost all of the ordinary electronic circuit elements, such as resistors, capacitors, diodes, and transistors.

Integrated circuits are used in great quantities in electronic devices, such as digital computers, because of their small size, low power consumption, and high reliability. The complexity of integrated circuits range from simple logic gates and memory units to large arrays capable of complete video, audio and print data processing. Presently, however, there is a demand for integrated circuit chips to accomplish more tasks in a smaller space while having even lower operating voltage requirements.

As stated above, integrated circuit chips are manufactured by successively growing or depositing layers of different materials on a substrate. Typically, the substrate is made from a thin slice or wafer of silicon. The active and passive components of the integrated circuit are then built on top of the substrate. The components of the integrated circuit can include layers of different conductive materials such as metals and semiconductive materials surrounded by dielectric insulator materials. In attempting to improve integrated circuit chips, attention has been focused upon reducing the thickness of the layers while improving performance.

For instance, one area of circuit chip technology needing improvement is in the growth or deposition of insulator or dielectric materials used in the chips. Such an insulator material should have a very high resistivity, and sustainability of subsequent process steps and materials used in chip manufacturing. The dielectric insulator materials are incorporated into integrated circuits in order to reduce power dissipation when the circuit is in use.

Thin dielectric layers are being used routinely in the manufacturing of semiconductor devices for applications such as gates, capacitor dielectrics, besides various other uses. The most prevalent dielectric used in semiconductor devices is silicon dioxide, which can be grown through the reaction of oxygen and silicon at high temperature. Alternatively, water ($H_2O$) can be reacted with silicon at high temperature to form silicon dioxide.

In the past, silicon dioxide layers have been grown in conventional batch furnaces and in rapid thermal processing systems. The use of rapid thermal processing systems offers the advantages of short time high temperature processing which provides process advantages over using conventional furnaces.

For instance, in the past, one particular method for forming and/or modifying a dielectric film on a semiconductor surface included the following steps:

a) exposing the semiconductor to a process gas comprising at least one reactive component at a predetermined first concentration C1 or partial pressure P1 to react with the semiconductor atoms. and/or molecules of the dielectric film while heating said semiconductor to form and/or modify said film or parts of it, b) heating said semiconductor and/or said dielectric film to a first temperature T1 such that said reactive component and/or parts of it may diffuse through said dielectric film and/or into a surface region of said semiconductor to form said film on the surface of said semiconductor and/or to increase said film in thickness by reaction nearby a first interface between said semiconductor and said dielectric film, said reaction involves said reactive component and/or parts of it, semiconductor atoms and/or molecules from the dielectric film.

Such a method is known in the art and described e.g. by B. E. Deal and A. S. Grove in J. Appl. Phys. 36 (1965) 3770. Other references that discuss the formation of dielectric layers include U.S. Pat. No. 6,100,149; U.S. Pat. No. 6,323,143; U.S. Pat. No. 6,191,052; U.S. Pat. No. 5,904,523; U.S. Pat. No. 5,726,087 and U.S. Pat. No. 6,218,720 which are all incorporated herein by reference.

As described above, in order to produce advanced, fast acting devices, a need currently exists for producing dielectric layers having a minimal thickness. Controlled stoichiometry, a small concentration of structural defects and dangling bonds in bulk and at the interface of the dielectric layer and very small interface roughness of the adjacent interfaces are also required for optimization of dielectric layers in semiconductor devices. As the thickness of such dielectric layers decreases, however, significant difficulties arise in being able to properly and repeatedly create and/or modify thin layers, such as layers having a thickness of less than about 8 nm.

In fact, even conventional 30 second to 120 second heating cycles conducted in rapid thermal processing chambers that are used to produce dielectric layers according to the Deal and Grove model referenced above become too long to provide control sufficient to meet some of the requirements that are currently being specified.

Thus, a need currently exists for a repeatable process for producing and/or modifying thin dielectric layers that have improved electrical properties.

SUMMARY OF THE INVENTION

The present invention generally relates to improved methods of forming and/or modifying a dielectric film on a semiconductor surface of a semiconductor by thermal processing of the semiconductor in a reaction chamber of a thermal processing reactor.

For instance, in one embodiment, the present invention is directed to a method of forming or modifying a dielectric film on a semiconductor surface of a semiconductor. The method includes the steps of providing a semiconductor defining a surface. A dielectric film and/or open surface parts are located on the surface of the semiconductor. The open surface parts may be covered by the native oxide film.

The semiconductor is exposed to a process gas in a thermal processing chamber. The process gas is or contains at least one reactive component at a first partial pressure (or concentration).

The semiconductor is heated to a first temperature while being exposed to the process gas. In accordance with the present invention, in one embodiment, the first temperature and the first partial pressure are selected such that the reactive component diffuses through the dielectric film to an interface area and reacts with the semiconductor. Further, the first temperature and the first partial pressure are also selected such that semiconductor atoms diffuse from the semiconductor through the dielectric film to an outer surface area and react with the reactive component (Transport limited reactions).

The above process can be used to modify a dielectric film or may occur during the formation of a dielectric film. The dielectric film can have a thickness of less than about 8 nm, such as from about 0.3 nm to about 5 nm or from about 0.5 nm to about 4 nm. The dielectric film can contain oxygen, nitrogen, carbon, a metal compound, or mixtures thereof. For example, the dielectric film can be a silicon oxide, such as silicon dioxide, a silicon oxynitride, a silicon carbide, or a silicon nitride.

In forming and/or modifying dielectric films, the present inventors have discovered that a parameter space is defined by the first partial pressure of the reactive component and the inverse temperature to which the semiconductor is heated. The parameter space includes a first parameter area which is dominated by diffusion of the reactive component through the dielectric film, a second parameter area which is dominated by the diffusion of semiconductor atoms through the dielectric film and a third parameter area in which a film is etched or decomposed. In one embodiment of the present invention, the first temperature and the first partial pressure of the reactive component are selected such that the process occurs at a border region between the first and second parameter areas.

In this manner, the relative rates of diffusion of the reactive component through the dielectric film and the semiconductor atoms through the dielectric film can be controlled. For instance, the above diffusion rates can differ by a factor less than 10, by a factor less than 5, or by a factor less than 2. In one embodiment, the diffusion rates can be substantially equal.

In still another embodiment of the present invention, prior to formation of the dielectric film, the semiconductor can be exposed to a second process gas optionally containing a second reactive component such as small amounts of oxygen and/or moisture, preferably in ppm level (ppm=parts per million). The second process gas can contain an inert gas, such as argon or nitrogen. The semiconductor can be heated to a second temperature such that processing occurs in the third parameter area and the native oxide on the semiconductor and/or the semiconductor surface is etched or decomposed. After being etched or decomposed, a dielectric film can be formed on the semiconductor and thereafter modified. This process can occur continuously all in a single processing chamber or can be conducted sequentially using different processing chambers. In one preferred embodiment, the semiconductor substrate is exposed to an oxidant-free neutral gas or vacuum and thermal treatment is conducted so that the native oxide from the semiconductor surface is removed but the semiconductor surface is not etched.

Other features and aspects of the present invention are discussed in greater detail below.

BRIEF DESCRIPTION OF THE DRAWINGS

A full and enabling disclosure of the present invention, including the best mode thereof to one of ordinary skill in the art, is set forth more particularly in the remainder of the specification, including reference to the accompanying figures in which.

DETAILED DESCRIPTION

In general, the present invention is directed to forming and/or modifying films on a semiconductor surface. The films, for instance, can be dielectric films that serve as insulators in integrated circuit devices.

More particularly, the present invention is directed to controlling not only the diffusion of reactive gases through a dielectric film that has been formed or is in the process of being formed, but is also directed to similarly controlling the diffusion of semiconductor atoms from a semiconductor to an exterior surface area of the dielectric film. The present invention is particularly well suited for forming and/or modifying dielectric films that are ultra thin. For instance, the films can have a thickness of less than about 8 nm, such as less than about 5 nm. For example, in one embodiment, the present invention is directed to treating ultra thin films having a thickness of from about 0.3 nm to about 4 nm, such as from about 0.5 nm to about 3 nm.

Through the process of the present invention, repeatable and uniform dielectric films can be grown and modified that have improved properties.

Figure 1:
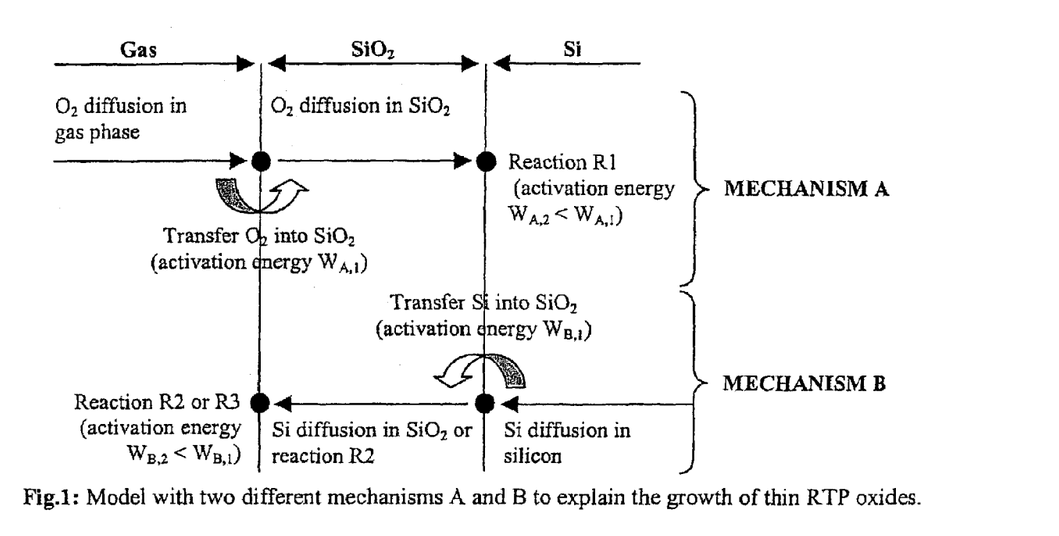
FIG. 1 is a diagram illustrating diffusion processes that may occur according to the present invention in the case of $SiO_2$ formation.

For purposes of explanation, FIG. 1 illustrates the mechanisms that occur when a dielectric film is being grown and/or modified. In the embodiment illustrated in FIG. 1, a silicon dioxide dielectric layer is shown positioned on a silicon semiconductor material. The silicon dioxide layer is exposed to a gas containing oxygen and heated.

As shown, during one embodiment of a process of the present invention, two mechanisms occur. The first mechanism, mechanism A, is based on the equilibrium between the diffusion of oxygen and its reaction with silicon at the silicon/silicon dioxide interface. Mechanism B, on the other hand, is directed to the diffusion of silicon atoms from the silicon material to the exterior surface of the silicon dioxide layer.

In the past, many conventional processes failed to appreciate the role of the diffusion of semiconductor atoms through the growing dielectric layer. The present inventors, on the other hand, have discovered the circumstances under which the diffusion of the semiconductor atoms play a dominant role in the electrical characteristics of the resulting ultra thin layers. Many prior methods, however, only took into account the diffusion of a reactant gas through the growing dielectric layer and the reaction rate of semiconductor atoms with the reactant gas at the interface between the dielectric layer and the semiconductor material.

According to the present invention, the role of diffusion of the semiconductor atoms through the forming dielectric layer is accounted for and controlled. Specifically, the present inventors have realized that silicon diffuses slowly through dielectric films and has a maximum diffusion length of less than about 5 nm, such as less than about 3.5 nm. Further, it has been discovered that the reaction rate of the semiconductor material with a reactant gas at the semiconductor/dielectric film interface is fast at conventional oxidation temperatures of about 900° C. to about 1150° C. and that the diffusion rate of semiconductor atoms rarely limits or influences the rate or stoichiometry of oxidation. In view of the above information, the present inventors have discovered that when the diffusion of a reactant gas through a dielectric film is somewhat close to equilibrium with the diffusion of semiconductor atoms to the exterior of the film, optimization of the properties of ultra thin dielectric films may be realized.

According to the present invention, dielectric films can be grown on a semiconductor surface or can be grown or modified on a pre-existing film. In various embodiments, dielectric films can also be modified by e.g. (1) etching, which usually reduces the thickness of the film and/or modifies the roughness or structure of the semiconductor surface, (2) growing, which increases the thickness of an already existing film such as a silicon dioxide or silicon nitride film, (3) reflow, which is typically done with glass materials, such as BPSG, or (4) chemical reactions such that the chemical structure of the dielectric film is changed. For example, silicon oxide may be converted to silicon oxynitride.

Dielectric films made according to the present invention can be grown and/or modified on any suitable semiconductor material. Examples of semiconductor materials include silicon, germanium, or mixtures thereof. The present invention may also be applied to other semiconductors like III-V-, II-VI- or IV—IV-semiconductors. Preferably the semiconductor is formed as a wafer substrate.

A dielectric film according to the present invention comprises at least one of the following components: oxygen, nitrogen, carbon (preferably in form of carbides), silicon oxide in the form $SiO_2$, silicon nitride in the form of e.g. $Si_3N_4$, silicon oxynitride $Si_xN_yO_z$ and/or silicon carbide SiC. Also metals can be part of the dielectric film like e.g. tungsten W, tungsten nitride WN and/or platinum Pt and/or hafnium and/or the respective metal oxides or metal nitrides.

A reaction chamber is a chamber in which the semiconductor or at least a part of it is exposed to a process gas and is thermally processed, meaning that the semiconductor or at least a part of it is subjected to a predetermined temperature-time-curve according to which the semiconductor or at least a part of it is heated while being exposed to the process gas for at least a period of the predetermined temperature-time-curve. The reaction chamber is part of a thermal processing reactor. The thermal processing reactor can be a furnace, a CVD reactor, a RTP- or RTCVD-reactor (rapid thermal processing reactor), or an epitaxial-, molecular beam epitaxial- or atomic layer deposition reactor.

Exposing the semiconductor and/or a film on the semiconductor to a process gas means that a process gas is brought in contact with at least one part of the semiconductor and/or film surface during a period of the temperature-time-curve. The process gas can contain an inert gas, meaning that no chemical and/or physical reaction (like e.g. adsorption, flow- or reflow of a surface area, diffusion into the surface area) with the semiconductor and/or any film happens during the thermal processing. Whether the process gas behaves like an inert gas or like a reactive gas depends on the temperature of the semiconductor and/or the process gas. Also the process gas can comprise or can be a reactive gas, causing chemical and/or physical reactions at the semiconductor and/or films on it.

Reactive gases that may be used in the process of the present invention include oxygen containing reactive gases, nitrogen containing reactive gases, reductive gases, gases for interface passivation, and the like. Examples of reactive components that may be contained in the process gas include oxygen such as molecular oxygen, water vapor, deuterium oxide ($D_2O$), ammonia, nitrous oxide ($N_2O$), nitric oxide (NO), deuterium ($D_2$), and hydrogen such as molecular hydrogen. In another embodiment, the reactive gas may be propane ($C_3H_8$), which may be used during a process for thermal silicon carbide film growth. The particular reactive gas present during the process of the present invention depends upon the film being grown and/or modified and the particular desired results.

In addition to a reactive component, the process gas can also include a carrier gas. In general, the carrier gas can be any gas that does not adversely interfere with the process being carried out. For example, in one embodiment, the carrier gas can be an inert gas, such as Argon.

The process gas can have atmospheric pressure, underpressure or overpressure. For many processes, for instance, the process gas can be at a pressure of from about 0.1 millitorr to about 1 atmosphere. Additionally the process gas can be a composition of various components which might change during thermal processing, meaning that the composition and/or concentration of at least one component of the composition is changing. Also the pressure (absolute pressure) of the process gas and/or the partial pressure of at least one component of the process gas (concentration) can be changed during the thermal processing.

The temperature to which the semiconductor substrate is heated during the process of the present invention can vary depending upon the film being modified or grown, the process gas, besides various other factors. In general, for instance, the temperature can vary from about 700° C. to about 1150° C. during thermal processing.

As described above, the present invention is generally directed to a method of forming and/or modifying a film during a semiconductor fabrication process in which a reactive component contained within a process gas diffuses through the dielectric film to a semiconductor material while semiconductor atoms also diffuse through the film to the exterior surface of the film. The reactive component diffusing through the film may react with the semiconductor material at the film/semiconductor interface. The semiconductor atoms, on the other hand, diffusing in the opposite direction through the film, can react at or near the surface of the film. Through this method, a dielectric film can be grown, can be chemically altered, or can otherwise be modified. Existing dielectric films that can be processed according to the present invention include thermally and/or epitaxially grown films, deposited films by CVD or by an atomic layer CVD process, or films which were previously modified by plasma treatment or ion implantation.

The process of the present invention occurs while a semiconductor substrate, such as a wafer, is heated and exposed to a process gas. More particularly, the semiconductor substrate is exposed to a process gas containing a reactive component at a first partial pressure. The semiconductor substrate is also heated to a first temperature. The first temperature and the first partial pressure (or concentration) is selected such that the reactive component of the process gas or parts of it can diffuse through the dielectric film and/or into a surface region of the semiconductor. For example, molecular oxygen may dissociate on the surface of the dielectric film (e.g. $SiO_2$) and/or the semiconductor (e.g. Si). Atomic oxygen may then diffuse through the film (e.g. silicon oxide $SiO_2$ or $Si_3N_4$), to react with silicon atoms nearby the interface between the semiconductor (e.g. silicon) and the film (e.g. $SiO_2$ or $Si_3N_4$).

Typically the reaction of the reactive component of the process gas or parts of it happens at the semiconductor surface, or at an interface area between the film and the semiconductor surface. The interface area, for instance, can be from about 0.3 nm up to about 2 nm from the semiconductor surface and can extend into the dielectric film or into the bulk material of the semiconductor.

According to the present invention, the temperature T1 and the concentration C1 or partial pressure P1 are selected such that in addition to the diffusion of the reactive component of the process gas or parts of it, semiconductor atoms also diffuse from the semiconductor bulk material through the dielectric film. Diffusion of the semiconductor atoms can occur to a pre-existing dielectric film or to a film that is in the process of being formed. The diffusion of the semiconductor atoms is to an outer surface area of the semiconductor and/or an outer surface area of the dielectric film, being in contact with the process gas. Due to the diffusion of the semiconductor atoms, the dielectric film can be increased (grown) and/or modified at the outer surface area, meaning at the surface which is in direct contact with the process gas. The chemical and/or physical reactions of the diffused semiconductor atoms with the process gas at the surface area mainly happens directly at the surface and up to about a depth of 1.5 nm from the surface (unless the film is thinner than about 1.5 nm).

The method according to the present invention advantageously forms and/or modifies a dielectric film by making use of both diffusion processes, the diffusion of the reactive component of the process gas or parts of it, and the diffusion of the semiconductor atoms. In order to better illustrate the present invention, FIG. 2 shows a parameter range of the inverse temperature 1/T versus the concentration C of the reactive component of the process gas, expressed in respective partial pressure P (designated as P0 in the figure), for the formation of silicon oxide.

Figure 2:
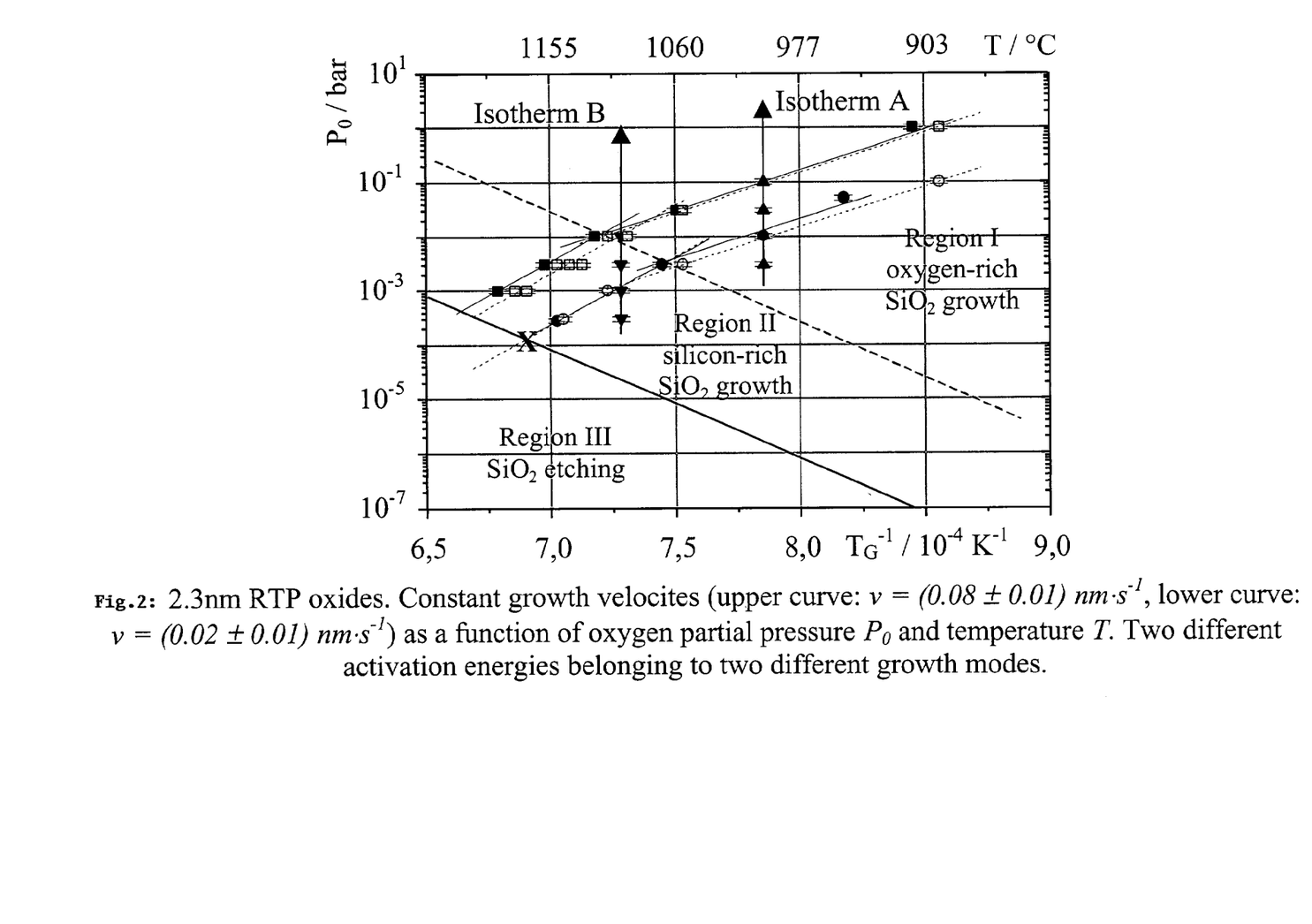
FIG. 2 is a graph of oxygen partial pressure versus inverse temperature for silicon dioxide films. The graph includes two curves that represent two growth velocities. The upper curve has a growth velocity of about 0.08 nm per second while the lower curve has a growth velocity of about 0.02 nm per second. The graph illustrates the different regions where different processes occur.

As shown, the graph of FIG. 2 includes an upper curve and a lower curve. The upper curve and the lower curve represent different growth velocities that were used and plotted.

As also shown, the graph of FIG. 2 is divided into 3 regions. Region I is a parameter area for forming silicon oxide in which silicon oxide film formation is dominated by the diffusion of atomic oxygen from the surface and through the dielectric film to the semiconductor. Region II, on the other hand, represents the parameter area in which the diffusion of silicon atoms from the semiconductor to an exterior surface area of the film significantly contributes to the formation and/or modification of the silicon oxide film. Region III is where decomposition and/or etching of the dielectric film occurs. This region comprises low pressure and vacuum ambient applications as well.

Although FIG. 2 is specifically directed to silicon dioxide films, it should be understood that similar graphs can be constructed for other dielectric films and/or semiconductor materials. For instance, it is believed that similar relationships can also be found for silicon oxynitride films, silicon carbide films, silicon nitride films, and the like.

For any given embodiment, to find optimal conditions for forming a thin dielectric layer, according to the present invention a parameter space defined by the concentration C or partial pressure P of the reactive component of the process gas or parts of it and the inverse temperature 1/T to which the semiconductor and/or film is heated during thermal processing is determined. The present invention can be applied in all cases in which the parameter space comprises a first parameter area (region 1) in which the formation and/or modification of the film is dominated by the diffusion of the reactive component or parts of it through the film, and a second parameter area (region 11) in which the formation and/or modification of the film is dominated by the diffusion of the semiconductor atoms.

Preferably, according to the present invention, the parameters T1 and C1 or P1 are selected such that they are at the border region between the first and the second parameter areas. In this case, the border region is a parameter space in which the contribution of the diffusing semiconductor atoms and the diffusion of the reactive component (or parts of it) to the formation or modification of the film is comparable with each other, meaning that their relative contributions to the formation or modification of the film differ less than a factor of ten, preferably less than a factor of five, most preferably less than a factor of two.

The present inventors have discovered that by forming and/or modifying a dielectric film during a process occurring between the first and second parameter areas as described above provides various benefits and advantages. In particular, ultra thin films can be grown or modified. Further, the films can be grown or modified in a uniform and repeatable manner. Ultimately, dielectric films can be created having improved electrical properties. The films can have, for instance, controlled stoichiometry, a minimal concentration of structural defects, and reduced amounts of interface roughness.

From the relationships represented in FIG. 2, it should also be understood that in other embodiments the temperature and partial pressure of the reacting gas can be changed or modified to arrive at other benefits and advantages. For example, in another embodiment of the present invention, an etching process of a dielectric film can be carried out. In this embodiment, the parameters T1 and C1 or P1 can be selected such that they are at the border region between the second and the third parameter areas. Here the border region is a parameter space in which the diffusion of semiconductor atoms significantly contribute to the etching of the film and/or semiconductor. In some cases, the modification of the film and/or semiconductor is dominated by the semiconductor atoms which are diffusing through the dielectric film.

In another embodiment, when a dielectric film is located on the semiconductor, the reactive component contained in the process gas (e.g. hydrogen) may react with the atoms and/or molecules contained in the dielectric film, forming a volatile component. Due to the presence of the reactive component, the dielectric film is essentially reduced or etched from the outer surface in a direction towards the semiconductor.

If, on the other hand, the diffusion of the semiconductor atoms through the dielectric film is significant, meaning that the parameters T1 and P1 or C1 are in the border region of the third and second parameter area, then a thermal treatment in neutral ambient may form volatile compounds with the diffused semiconductor atoms near the outer exterior surface of the dielectric film and the film can be etched and removed. For example Si atoms diffuse through the native oxide layer ($SiO_2$) and reduce the outside surface of the $SiO_2$ layer to volatile SiO.

In still another embodiment of the present invention, the semiconductor wafer is exposed to a process gas being an inert gas or having at least one reactive component at a predetermined second concentration C2, corresponding to a pressure or partial pressure P2. The reactive component of concentration C2 reacts with the semiconductor atoms and/or film molecules of the dielectric film while heating the semiconductor and/or film to form and/or modify the film or the semiconductor surface or parts of it.

By processing the semiconductor and/or film for a certain time with parameters from the third area or the border area of the third and second parameter areas of the mentioned parameter space, as an example, an already existing film on a semiconductor can be reduced in thickness or can even be totally removed. Thus, the above process for etching a semiconductor substrate or decomposing an existing deposit can be utilized as a cleaning step prior to forming a film on the substrate.

For instance, after the above process, the process parameters (and process gas) may be changed such that thermal processing is done in the second parameter area with a temperature T1 and concentration C1 (or pressure P1) to form a very thin dielectric film, preferably with a thickness of less than 8 nm, more preferably less than 5.0 nm and most preferably less than 3.0 nm. This optional sequential process can be done in the same reaction chamber immediately after the first step of processing with the parameters T2 and C2, or it can be done in another reaction chamber at a later time. However, the first is preferred so as to have an integrated process of e.g. cleaning of a semiconductor surface followed by a film forming step to form a high quality ultra-thin film on the cleaned semiconductor surface.

As one example, an already existing film may be a native oxide or some arbitrary kind of very thin oxide layer on a silicon wafer, meaning a $SiO_2$-film on a silicon surface. Such a film can be reduced in thickness by the first process step, i.e. processing the semiconductor with the parameters T2 and C2 (P2). Alternatively, the film can be completely removed. As described above, in this embodiment, Argon and/or other noble gases can be used as an inert gas and the reactive component C2 may be formed during the process.

After the semiconductor substrate has been subjected to a cleaning/etching process, a high quality ultra-thin film, such as a silicon dioxide film, may be grown from a process gas containing a reactive component at a partial pressure (P1) and at a temperature, (T1). The film may be grown during a process at which the temperature and partial pressure are selected in the second parameter area, for instance Region II in the graph shown in FIG. 2. Alternatively, or in addition to the above, the process gas may also contain a nitrogen component which can be used to incorporate nitrogen into the dielectric film being grown and/or modified.

After formation of the dielectric film, the semiconductor substrate can undergo further processing. For example, in one embodiment, the temperature to which the semiconductor is heated and/or the concentration of the reactive component in the process gas can be changed such that thermal processing is continued in the first parameter area (Region I and FIG. 2), to form a second layer or film on top of the already grown dielectric film. Alternatively, in this embodiment, the process can be used to increase the thickness of the already grown dielectric film.

In still another embodiment of the present invention, after the dielectric film has been formed or after a portion of the film has been formed, the temperature and the partial pressure of the reactive component in the process gas can also be changed such that further processing occurs within the border region between the first parameter area and the second parameter area. Specifically, the temperature and partial pressure are selected such that diffusion of the reactive component occurs through the dielectric film and diffusion of semiconductor atoms occur from the semiconductor to the exterior surface of the dielectric film. As described above, in this manner, the properties of ultra-thin films can be enhanced and improved.

Thus, by understanding the relationships between the inverse temperature and the partial pressure of a reactive component contained within a thermal processing chamber, various films having ultra-thin thicknesses may be formed and created with desired properties. Further, the process of the present invention allows for a cleaning step to occur prior to the formation of any film. Again, these processes can occur in a controlled and reproducible manner.

In addition to the above, various other process steps may be incorporated into the present invention for further improving film properties. For example, in one embodiment, various cleaning processes may be used prior to formation of the dielectric film. These cleaning processes may occur in addition to the above described etching process or may replace the above described etching process.

For example, in one embodiment, the semiconductor substrate can be subjected to a conventional wet chemical cleaning process. Storage of wafers after wet chemical cleaning, however, may lead to some deposits of organic contamination on the wafer surface. If organic contamination occurs, the contamination may be removed in situ prior to forming any dielectric layers by treating the semiconductor substrate with ozone at a temperature of about 200° C. Instead of ozone, the semiconductor substrate may also be exposed to oxygen at slightly higher temperatures.

As described above, native oxide layers typically should be removed prior to formation of the dielectric film. In addition to or instead of the above described etching process for removing native oxide layers, other possible cleaning steps may include annealing the semiconductor substrate under vacuum or in the presence of an inert gas, such as Argon, at a temperature of about, for instance, 900° C. The annealing process may be done in a relatively short amount of time, such as within about 30 seconds. Before removing the native oxide layer by thermal treatment, the semiconductor substrate may be passivated if desired. For instance, hydrogen passivation may occur in hydrogen plasma or by dipping the semiconductor substrate into a dilute hydrofloric acid solution (0.5% HF solution for 3 minutes and drying).

After cleaning a semiconductor substrate with, for instance, Argon, the semiconductor surface is very reactive. Thus, when forming a dielectric film, initially the diffusion rate of the semiconductor atoms through the growing film is relatively small and depends on the momentary thickness of the dielectric layer. The supply of the reactant ambient atoms is limited by the small concentration of the reactive gas. With the above factors in mind, in some embodiments, it may be beneficial to ramp the temperature or the gas concentration during the thermal growth process. For example, during a nitridation process (see Example 5 below) the temperature may be ramped between 1050° C. and 1100° C. in a non-linear fashion.

After removal or decomposition of any native oxide layers, the semiconductor substrate may also be subjected to a high temperature neutral gas anneal or vacuum anneal. For instance, the substrate may be annealed at a temperature of from about 1150° C. to about 1200° C. Annealing the substrate after removal of native oxide layers may improve atomic flatness by surface reconstruction.

For example, in one embodiment, an ultra thin silicon nitride layer may be formed. For instance, in one embodiment, the silicon nitride film may have a thickness of less than about 50 angstroms such as having a thickness of about 20 angstroms. In forming the silicon nitride layer, a semiconductor substrate may be cleaned using, for instance, an Argon gas as described above. Once the substrate is cleaned, the silicon nitride layer may be formed followed by an annealing step as also described above.

After forming the dielectric layer, such as the silicon nitride layer, the layer may be modified by successive thermal treatments in an arbitrary process integration of the semiconductor device production. For instance, in one embodiment, a preferred method may be slight wet oxidation.

The present invention may be better understood with reference to the following examples.

EXAMPLES

In the following examples, a semiconductor wafer was processed in a thermal processing reactor in order to form a dielectric film according to the present invention. The semiconductor wafer prior to processing has free surface parts or coated only by native silicon oxide. In the examples, the preferred orientation is 100 but, especially in the case of nitridation, other orientations such as 111 may be sometimes more advantageous.

Prior to processing, the semiconductor wafers were subjected to a standard and conventional wet chemical cleaning. All of the below processes were carried out at atmospheric pressure in a rapid thermal processing chamber.

Example 1

A semiconductor wafer was placed in a rapid thermal processing chamber and heated to 900° C. while being exposed to an Argon gas. The thermal treatment in neutral gas ambient decomposed and removed native oxides.

Next, the semiconductor wafer was heated to 1050° C. for 100 seconds in a process gas that contained Argon and 5000 ppm of molecular oxygen at atmospheric pressure. A silicon dioxide film was grown having a thickness of 2.4 nm. The oxidation parameters above are near the boundary line of Region I and Region II as shown in FIG. 2.

Example 2

A semiconductor wafer was placed in a low pressure rapid thermal processing chamber and heated to 900° C. while being exposed to low pressure (e.g. <1 mTorr) or vacuum. The thermal treatment in low pressure or vacuum decomposed and removed native oxides.

Next, the semiconductor wafer was heated to 1100° C. for 25 seconds in a process gas that contained Argon and 1% molecular oxygen by volume at atmospheric pressure. A silicon dioxide film was grown having a thickness of 2.3 nm. The oxidation parameters above are near the boundary line of Region I and Region II as shown in FIG. 2.

Example 3

A semiconductor wafer was placed in a rapid thermal processing chamber and heated to 900° C. while being exposed to an ambient containing Argon gas and 10% Hydrogen. The Hydrogen gas accelerated the removement of native oxides.

Next, the semiconductor wafer was heated to 1000° C. for 20 seconds in a process gas that contained Argon and 10% molecular oxygen by volume at atmospheric pressure. A silicon dioxide film was grown having a thickness of 2.3 nm. The above conditions were found to be farther from the boundary line of Region I and Region II from Examples 1 and 2.

After the dielectric film was grown, a post oxidation anneal was carried out at 1000° C. for 30 seconds in an Argon gas. The post oxidation anneal improved exact stoichiometry by decreasing the excess oxygen contained in the dielectric layer.

Example 4

A semiconductor wafer was placed in a rapid thermal processing chamber and heated to 900° C. while being exposed to an Argon gas. The Argon annealing gas decomposed and removed native oxides. Next, the semiconductor wafer was heated to 1130° C. for 2 seconds in a process gas that contained Argon and 3% molecular oxygen by volume and 3% dinitrogen oxide (nitrous oxide, $N_2O$) or nitric oxide (NO) by volume at atmospheric pressure. A silicon oxynitride film was grown having a thickness of 2.3 nm. The oxidation parameters above are near the boundary line of Region I and Region II.

Example 5

A semiconductor wafer was placed in a rapid thermal processing chamber and heated to 900° C. while being exposed to an Argon gas. The Argon annealing gas decomposed and removed native oxides.

Next, the semiconductor wafer was heated to 1100° C. for 45 seconds in a process gas that contained Argon and 10% $NH_3$ by volume at atmospheric pressure. A silicon nitride film was grown having a thickness of 2.0 nm.

Example 6

Silicon wafers made according to Example 5 above were subjected to a post nitridation annealing process. For example, one wafer was heated for 30 seconds in $NH_3$ in 900° C. while another wafer was heated also for 30 seconds at 1000° C. in molecular nitrogen. A third wafer was heated to 1000° C. for 5 seconds in the presence of water ($H_2O$) or deuterium oxide ($D_2O$) (Post nitridation anneal using wet Rapid Thermal Oxidation). In another embodiment, a fourth wafer may be heated to 900° C. for 30 sec in the presence of $H_2$ or $D_2$ (deuterium).

Examples 7 and 8 described below are prophetical examples.

Example 7

The process described in Example 5 above may be repeated. In this example, however, the wafer is subjected to a thermal treatment at 1200° C. for 15 seconds in Argon gas after the Argon clean step but before formation of the dielectric film. The thermal treatment makes the surface of the wafer atomically flat. It is believed that the surface of the wafer is improved due to the higher mobility of silicon atoms on the surface at high temperature and due to the effect that any silicon carbide agglomerations that may have been present on the surface disappear at high temperature by diffusion into the bulk silicon wafer. Silicon carbide agglomerations can occur, for instance, by previous carbon or organic contamination.

Example 8

A silicon wafer is placed in a rapid thermal reactor. After argon cleaning similar to the previous methods at 900° C. ultrathin SiC layer can be grown at about 1250° C. The process gas may be propane ($C_3H_8$) diluted in $H_2$.

In Example Nos. 5, 6 and 7 above, interface engineering of the substrate occurs prior and after to formation of the dielectric layer. The above processes are particularly well suited for use in gate stack applications in the production of polysilicon gate devices. For instance, ultra thin silicon nitride layers may be grown having a thickness from a monomolecular layer up to about 2 nm. These ultra thin silicon nitride layers can be applied for future metal-gate or metal-nitride gate devices even as single dielectrics due to their excellent barrier properties. The above layers allow reliable contact formation not only to silicon but also to the above mentioned gate materials. Due to the good barrier properties of the ultrathin nitride layers, these layers can be used for dopant loss reduction during implant annealing as well.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed:

1. A method of forming or modifying a dielectric film on a semiconductor surface of a semiconductor comprising:
   providing a semiconductor defining a surface, wherein the semiconductor is selected form a group consisting of silicon, germanium, or mixtures thereof;
   exposing the semiconductor to a process gas in a thermal processing chamber, the process gas comprising at least one reactive component, the reactive component being at a selected partial pressure, the reactive component comprising oxygen or nitrogen;
   heating the semiconductor to a selected temperature while being exposed to the process gas, the temperature and the partial pressure being selected such that from the reactive component diffuses through the growing or existing dielectric film located on the surface of the semiconductor to an interface area and reacts with the semiconductor, and wherein the temperature and the partial pressure are also selected such that semiconductor atoms diffuse from the semiconductor through the dielectric film to an outer surface area and react with the reactive component; and
   wherein a parameter space is defined by the partial pressure of the reactive component and the inverse temperature to which the semiconductor is heated, the parameter space comprising a first parameter area which is dominated by diffusion of the reactive component through the film and a second parameter area which is dominated by the diffusion of the semiconductor atoms through the film, and wherein the selected temperature and the selected partial pressure is at a border region between the first and second parameter areas so that the oxygen or nitrogen gas is diffusing through the dielectric film to the interface area and semiconductor atoms are simultaneously diffusing through the film to the outer surface, thereby growing a dielectric film having a thickness of from about 0.3 nm to about 8 nm.

2. A method as defined in claim 1, wherein the dielectric film has a thickness of from about 0.5 nm to about 5 nm.

3. A method as defined in claim 1, wherein the dielectric film contains oxygen, nitrogen, carbon, a metal compound or mixtures thereof.

4. A method as defined in claim 3, wherein the dielectric film is selected from a material consisting of a silicon oxide, a silicon oxynitride, silicon carbide, or a silicon nitride.

5. A method as defined in claim 1, wherein the process gas is below atmospheric pressure.

6. A method as defined in claim 1, wherein the parameter space further comprises a third parameter area in which the film is decomposed or etched.

7. A method as defined in claim 6, wherein prior to exposing the semiconductor to the selected first process gas and temperature, the semiconductor is exposed to a second process gas at a second partial pressure while heating the semiconductor to a second temperature such that the second partial pressure and inverse second temperature is within the third parameter area.

8. A method as defined in claim 1, wherein the process gas comprises an inert gas.

9. A method as defined in claim 1, wherein the relative rates of diffusion of the reactive component through the film and the semiconductor atoms through the film differ by a factor of less than 10.

10. A method as defined in claim 1, wherein the process gas comprises nitric oxide or nitrous oxide and the dielectric film comprises silicon oxynitride.

11. A method as defined in claim 1, wherein the relative rates of diffusion of the reactive component through the film and the semiconductor atoms through the film differ by a factor of less than 2.

12. A method as defined in claim 1, wherein the dielectric film comprises silicon dioxide and wherein the reactive component comprises oxygen and/or water.

13. A method as defined in claim 1, wherein the dielectric film comprises silicon nitride or silicon oxynitrides and the reactive component comprises NH3.

14. A method as defined in claim 1, wherein the semiconductor defines a clean surface or a hydrogen passivated surface prior to being exposed to the process gas in the thermal processing chamber.

15. A method as defined in claim 1, wherein a pre-existing dielectric film is located on the surface of the semiconductor prior to being exposed to the process gas.

16. A method of modifying a dielectric film on a semiconductor surface of a semiconductor comprising:
   providing a semiconductor defining a surface, the semiconductor comprising silicon, germanium, or mixtures thereof, a dielectric film being located on the surface of the semiconductor, the dielectric film having a thickness of from about 0.3 nm to about 8 nm, the dielectric film is selected a group consisting of a silicon oxide, a silicon carbide, a silicon oxynitride, or a silicon nitride;
   exposing the semiconductor to a selected temperature and to a selected partial pressure of a process gas in a thermal processing chamber, the process gas comprising at least one reactive component, the reactive component comprising oxygen or nitrogen;
   wherein a parameter space is defined by the partial pressure of the reactive component and the inverse temperature to which the semiconductor is heated, the parameter space comprising a first parameter area which is dominated by diffusion of the reactive component through the film and a second parameter area which is dominated by the diffusion of the semiconductor atoms through the film, and wherein the selected temperature and the selected partial pressure is at a border region between the first and second parameter areas so that the oxygen or nitrogen gas is diffusing through the dielectric film to the interface area and semiconductor atoms are simultaneously diffusing through the film to the outer surface, and heating the semiconductor at the selected temperature while being exposed to the process gas, such that the relative rates of diffusion of the reactive component through the dielectric film and the semiconductor atoms through the dielectric film differ by a factor less than 10.

17. A method as defined in claim 16, wherein the dielectric film has a thickness of from about 0.3 nm to about 5 nm.

18. A method as defined in claim 16, wherein the process gas is below atmospheric pressure.

19. A method as defined in claim 16, wherein prior to exposing the semiconductor to the first process gas, the semiconductor is exposed to a second process gas comprising at least one reactive component and a second partial pressure while heating the semiconductor to a second temperature such that the second partial pressure and inverse second temperature is within the third parameter area.

20. A method as defined in claim 16, wherein the process gas further comprises an inert gas.

21. A method as defined in claim 16, wherein the relative rates of diffusion of the reactive component through the dielectric film and the semiconductor atoms through the dielectric film differ by a factor less than 5.

22. A method as defined in claim 16, wherein the relative rates of diffusion of the reactive component through the dielectric film and the semiconductor atoms through the dielectric film differ by a factor less than 2.

23. A method as defined in claim 16, wherein the reactive component is selected from a group consisting of oxygen and/or $H_2O$ or $D_2O$ or $NH_3$ or $H_2$.

24. A method as defined in claim 16, wherein the dielectric film comprises silicon dioxide or silicon nitride or oxynitride.

25. A method of growing a dielectric film on a semiconductor surface of a semiconductor comprising: providing a semiconductor defining a surface, wherein the semiconductor is selected from a group consisting of silicon, germanium, or mixtures thereof; exposing the semiconductor to a process gas in a thermal processing chamber at a selected temperature, the process gas comprising at least one reactive component, wherein the reactive component being at a selected partial pressure and the process gas being formulated so as to grow a dielectric film on the surface of the semiconductor, wherein the reactive component comprising oxygen or nitrogen, and thereby forming the growing dielectric film having a thickness from about 0.3 nm to about 8 nm; wherein a parameter space is defined by the partial pressure of the reactive component and the inverse temperature to which the semiconductor is heated, the parameter space comprising a first parameter area which is dominated by diffusion of the reactive component through the film and a second parameter area which is dominated by the diffusion of the semiconductor atoms through the film, and wherein the selected temperature and the selected partial pressure at border region between the first and second parameter areas so that the oxygen or nitrogen gas is diffusing through the dielectric film to the interface area and semiconductor atoms are simultaneously diffusing through the film to the outer surface, and heating the semiconductor to the selected temperature while being exposed to the process gas for growing the dielectric film, and the partial pressure being also selected such that the relative rates of diffusion of the reactive component through the growing dielectric film and the semiconductor atoms through the growing dielectric film differ by a factor less than 10.

26. A method as defined in claim 25, wherein the dielectric film has a thickness of from about 0.3 nm to about 5 nm.

27. A method as defined in claim 25, wherein the process gas is below atmospheric pressure.

28. A method as defined in claim 25, wherein prior to exposing the semiconductor to the selected first process gas and selected first temperature, the semiconductor is exposed to a second process gas and a second partial pressure while heating the semiconductor to a second temperature such that the second partial pressure and inverse second temperature is within the third parameter area.

29. A method as defined in claim 25, wherein the process gas further comprises an inert gas.

30. A method as defined in claim 25, wherein the relative rates of diffusion of the reactive component through the dielectric film and the semiconductor atoms through the dielectric film differ by a factor less than 5.

31. A method as defined in claim 25, wherein the relative rates of diffusion of the reactive component through the dielectric film and the semiconductor atoms through the dielectric film differ by a factor less than 2.

32. A method as defined in claim 25, wherein the reactive component is selected from a group consisting of oxygen and/or $H_2O$ or $D_2O$ or $NH_3$ or $H_2$ or $D_2$.

33. A method as defined in claim 25, wherein the dielectric film comprises silicon dioxide or silicon nitride or oxynitride.

* * * * *